United States Patent [19]

Kitamura

[11] 3,742,771

[45] July 3, 1973

[54] PRESET TUNING DEVICE FOR TELEVISION RECEIVER

[75] Inventor: Hitoshi Kitamura, Osaka, Japan

[73] Assignee: Sanyo Electric Co., Ltd., Moriguchi-shi, Osaka-fu, Japan

[22] Filed: Jan. 18, 1972

[21] Appl. No.: 218,794

[30] Foreign Application Priority Data

Jan. 20, 1971 Japan .................................. 46/1755
Aug. 2, 1971 Japan .................................. 46/58090

[52] U.S. Cl. .................................................. 74/10.6
[51] Int. Cl. ............................................. F16h 35/18
[58] Field of Search ....................................... 74/10.6

[56] References Cited

UNITED STATES PATENTS 3,555,914 1/1971 Mase .................................. 74/10.6
3,561,275 2/1971 Mayer et al. .......................... 74/10.6

*Primary Examiner*—Milton Kaufman
*Attorney*—Staas, Halsey & Gable

[57] ABSTRACT

A tuning device for a UHF tuner includes a rotatable drum rotatable step-by-stop by turning a tuning shaft of the tuning device, a plurality of adjustable control elements loosely carried by the rotatable drum and a tuner operating member for operating the tuner to select a desired one of UHF channels. The tuner operating member can be operated by the adjustment of any selected one of the control elements thereby permitting the tuning of the tuner.

4 Claims, 6 Drawing Figures

Figure 4:
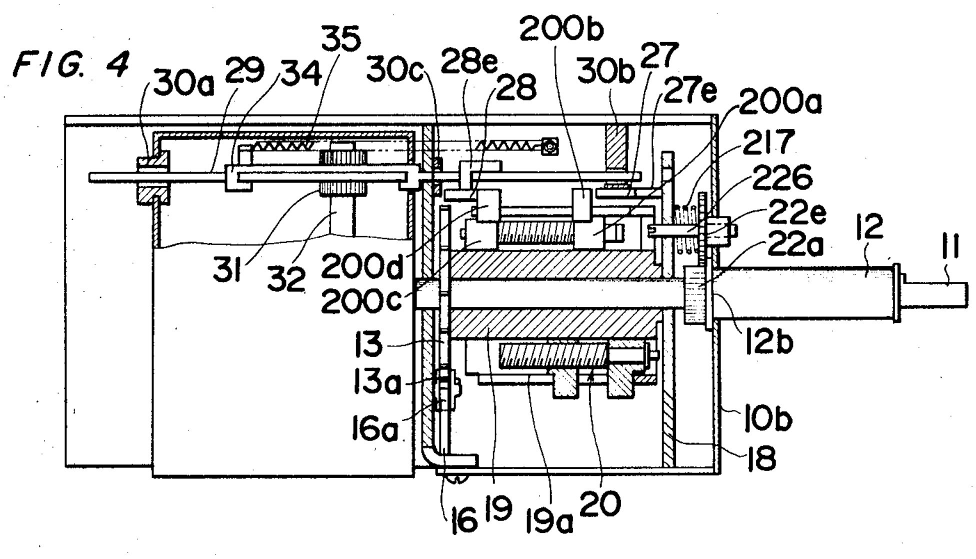

FIG. 2
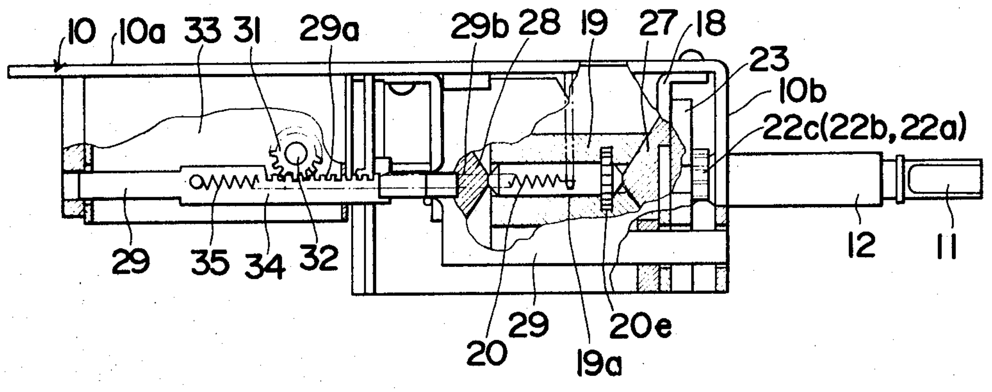
FIG. 1
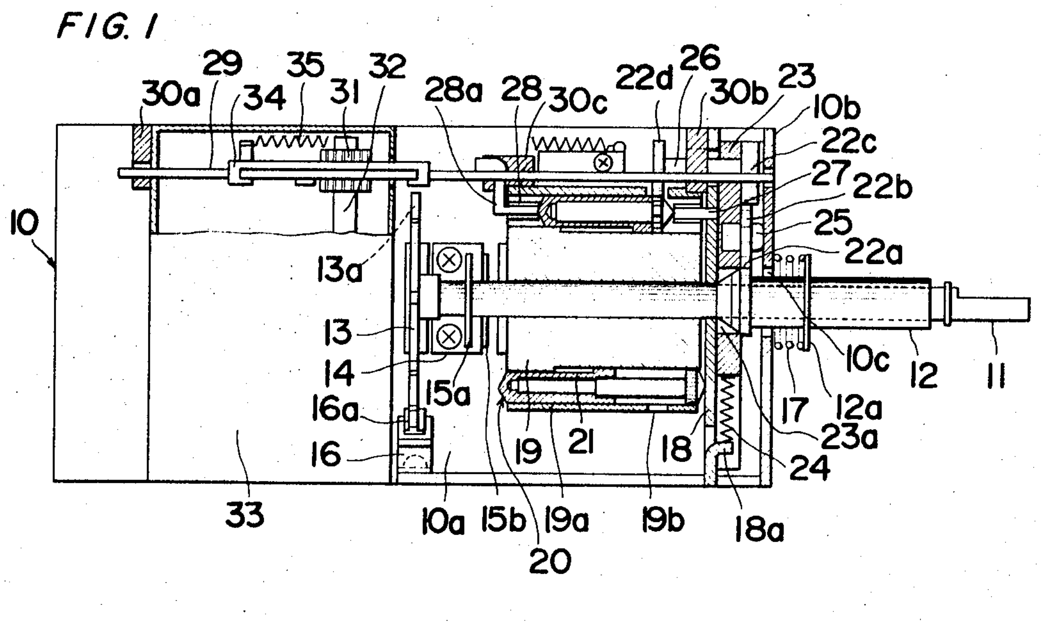
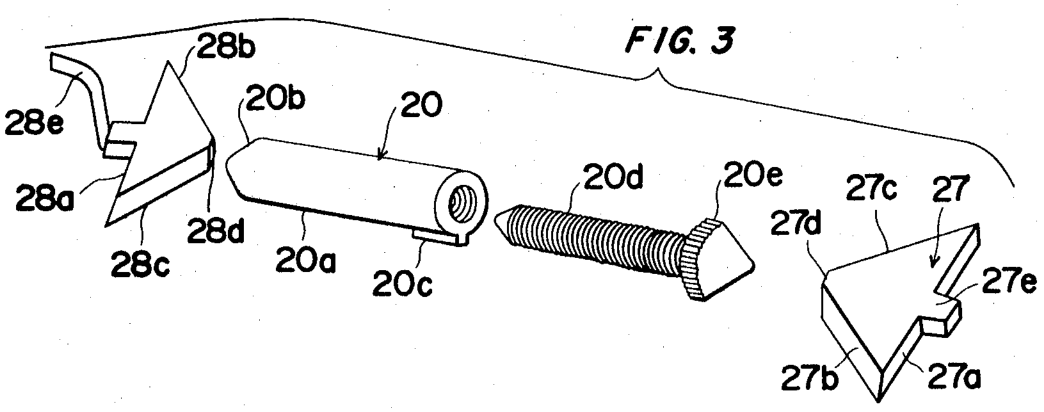

PRESET TUNING DEVICE FOR TELEVISION RECEIVER

The present invention relates to a preset tuning device for use in a television receiver and, more particularly, to a step-by-step preset tuning device for an ultrahigh frequency television tuning device.

In the current television broadcasting industry, the number of UHF television stations is increasing and, in some country, more than 70 channels in the ultrahigh frequency band have been allocated to a number of television broadcasting stations. While the number of UHF television stations is in fact exceeding the number of VHF television stations, UHF channel selection is largely carried out by continuously rotating a tuner control knob operatively associated with any known type of tuner. However, from the TV user's point of view, it is truly desirable to provide the same general type of tuning operation for UHF channels as for the VHF channels, whereby UHF channel selection can be also carried out by rotating step-by-step the tuner control knob.

To meet this requirement, there have been recently proposed various types of tuning devices to facilitate UHF channel selection substantially in the same manner as largely carried out in VHF channel selection. Of them, one exemplary type is designed such as essentially comprising a rotatable drum or cam member which carries a plurality of adjustable control elements which may be preset to a particular channel tuning position, said cam member being rotatable by the channel selecting shaft to bring the tips of the control elements against a tuner actuating member which controls the movement of the tuner shaft. The adjustment of the control elements is provided in order to permit a presetting of a desired one of a plurality of channels covered by one particular detent stop position of the rotatable drum.

In such device, each control element is composed of an elongated pin and at least one projection threadably mounted on said elongated pin and engageable with a cam follower operatively connected with the tuner shaft through the tuner actuating member. The pin is merely rotatably carried by the rotatable drum over the periphery thereof without occurring any displacement in the axial direction of said pin. Variation of the length of the control element which is defined between one of the ends of said pin to the projection movable in the axial direction thereof in response to the rotation of the pin is transmitted to the tuner actuating member through the cam follower constantly in contact with the projection.

However, there can be found a disadvantage in that, since the whole control elements are fixed with respect to the rotatable drum, the resettability is reduced once the rotatable drum has been axially deviated. As is well known, the resettability of the tuner is one of the most significant problems to be considered in the step-by-step tuner. For acceptable color TV reception, the step-by-step tuner should be resettable to within a certain range of small tolerance of a given frequency. Accordingly, any deviation in resettability which occurs upon axial displacement of the rotatable drum carrying the control elements will result in degradation of the color picture representation, requiring an additional manual adjustment to retune to the desired station.

Accordingly, an essential object of the present invention is to provide a step-by-step preset tuning device of the type wherein the resettability of the tuner can be ensured with great accuracy.

Another object of the present invention is to provide a step-by-step preset tuning device of the type wherein a plurality of adjustable control elements are axially displaceably accommodated in the rotatable drum in parallel relation with respect to the axial direction of said drum so that, even when the rotatable drum is axially displaced or deviated during the life time of the tuning mechanism, no reduction in resettability of the tuner takes place.

A further object of the present invention is to provide a step-by-step preset tuning device of the type wherein the employment of bearing members heretofore largely used to compensate for the deviation of the rotatable drum, which results in the increase of the manufacturing cost of the tuner mechanism, is substantially eliminated without any reduction in availability of a smooth rotation of the rotatable drum to any one of the detent stop positions.

A still further object of the present invention is to provide a step-by-step preset tuning device of the type which can be manufactured with a minimum number of movable parts and at low cost in a simplified construction without any reduction in performance and with an improved durability.

According to the present invention, there is provided a step-by-step preset tuning device particularly for use in association with an ultrahigh frequency television tuner which essentially comprises a rotatable drum having a plurality of detent stop positions and formed with a plurality of holes each extending in the axial direction of said drum and arranged in equally spaced relation over the periphery thereof, a plurality of adjustable control elements axially diaplaceably accommodated in said respective holes of the rotatable drum, a pair of fixed and movable cam members, and a tuner operating mechanism wherein, when the rotatable drum is in any selected one of the detent stop positions, the corresponding one of the control elements can be positioned such as to be sandwiched between said fixed and movable cam members. While in this condition, when the tuning shaft is subsequently turned, the overall length of the control element can be extended or reduced depending upon the direction of the rotation of the tuning shaft, such variation of the overall length of said control element being in turn converted into a rotational force necessary to set the tuner by means of the tuner operating mechanism. Once the setting of the tuner thus completed, any subsequent rotation of the rotatable drum back to that particular detent stop position causes the tuner to be reset to that particular channel with great accuracy.

Furthermore, according to the present invention, because of the particular size of each of the fixed and movable cam members, a smooth sliding engagement between either of the cam surfaces of each of the fixed and movable cam members and the respectively corresponding ones of the tapered ends of the control element can be advantageously ensured so that any one of the control elements can be successively held in place while sandwiched between the fixed and movable cam members as the rotatable drum is rotated step-by-step. In addition, a relatively great stroke of movement of the tuner operating member can be available with the simplified construction of the tuner mechanism of the present invention. The greater the stroke is available, the more the coverage of channels is available in one particular detent stop position of the rotatable drum.

Although a detailed description will not be made, a channel indicator assembly which may comprise a rotatable translucent drum having the channel numbers carried thereon and a viewing window frame secured so as to expose the selected one of the channel numbers to which the tuner can be tuned may be operatively connected with the tuning mechanism of the present invention in any known manner. Since the present invention is not directed to such a channel indicator assembly, no description will be made in the body of this specification.

Figure 5:
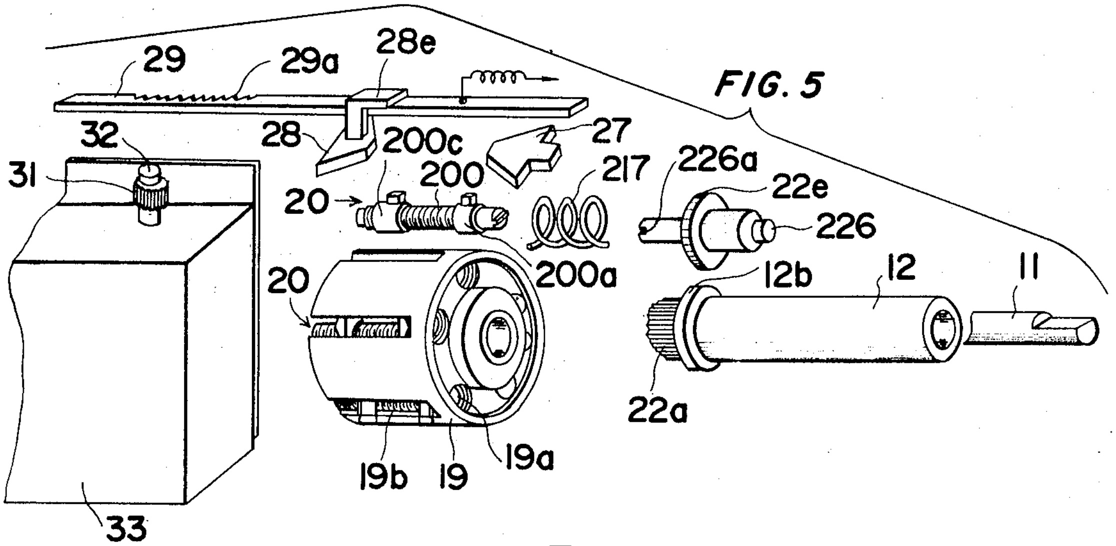
Figure 6:
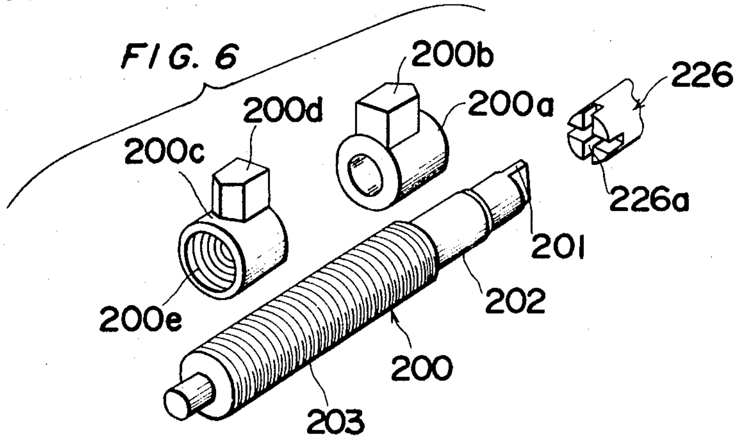

These and other objects and features of the present invention will become understood from the following description taken in conjunction with preferred embodiments thereof with reference to the accompanying drawings, in which:

FIG. 1 is a top plan view, portions being broken away, of a preset tuning mechanism constructed in accordance with the teaching of the present invention, FIG. 2 is a longitudinal side sectional view of the preset tuning mechanism shown in FIG. 1, FIG. 3 is an exploded view, on an enlarged scale, of one of the adjustable control elements employed in the preset tuning mechanism shown in FIG. 1, FIG. 4 is a longitudinal side sectional view of the preset tuning mechanism in another embodiment of the present invention, FIG. 5 is an exploded view, on an enlarged scale, of an essential portion of the preset tuning mechanism shown in FIG. 4, and FIG. 6 is an exploded view, on an enlarged scale, of one of the control elements employed in the preset tuning mechanism shown in FIG. 4.

Before the description proceeds, it is to be noted that like parts are designated by like reference numerals throughout the various views of the accompanying drawings. Particularly with reference to the drawings, the tuning mechanism according to the present invention broadly includes an ultrahigh frequency tuner suitably mounted for operation by a control knob through a power transmission mechanism which acts to transmit a rotational force, that has been imparted to the control knob, to a tuner shaft by means of the selected one of a plurality of control elements suitably spacedly carried by a rotatable drum having detent stop positions of the number substantially corresponding to the number of the control elements.

Referring now to FIG. 1 through FIG. 3 in which a first preferred embodiment of the present invention is shown, in order to facilitate the installation of the tuning mechanism in a television receiver, a mounting framework, generally indicated by 10, is provided as having a side plate 10*a* and a front plate 10*b* extending substantially at right angles to said side plate 10*a* and formed at a substantially central portion with an opening 10*c* for rotatably receiving therethrough an ultrahigh frequency (UHF) channel selecting shaft 11 and a tuning shaft 12 of a length smaller than that of the channel selecting shaft 11 and rotatably mounted around said selecting shaft 11. The channel selecting shaft 11 has one end situated outside the front plate 10*b* and rigidly mounted with a suitable knob (not shown) and the other and rigidly mounted with a turret disc 13. This turret disc 13 is formed around the periphery thereof with a plurality of equally spaced detent notches 13*a*.

The channel selecting shaft 11 is also supported at a position adjacent to said other end thereof by a suitable bearing member secured to the side plate 10*a* of the framework 10. For the purpose of preventing the channel selecting shaft 11 from being displaced in the axial direction thereof, means for this purpose may be provided in any known manner. However, in the instance as shown, a pair of retaining members 15*a* and 15*b* (see FIG. 1) which may be employed in the form of snap rings or circlips, are mounted on the channel selecting shaft 11 on the both sides of the bearing member 14 so that the axial displacement of the shaft 11 can be advantageously restricted by the bearing member 14 sandwiched between the pair of said retaining members 15*a* and 15*b*.

Provided to act in cooperation with the detent notches 13*a* formed on the periphery of the turrent disc 13 is a detent spring 16 having one end secured to the side plate 10*a* and the other end rotatably carrying a detent wheel 16*a* normally urged toward the axis of the turret disc 13 by the intrinsic resiliency of the detent spring 16 so that, as the channel selecting shaft 11 is rotated in the direction either clockwise or counterclockwise, the detent wheel 16*a* can be collapsibly engaged in a selected one of the detent notches 13*a* of the turret disc 13.

The tuning shaft 12, which may be employed in the form of a hollow tubing having a sufficient thickness, has one free end situated outside the front plate 10*b* and preferably extended to a position inwardly adjacent to the knob rigidly mounted on the free end of the channel selecting shaft 11. This free end of the tuning shaft 12 may be rigidly mounted with a control knob (not shown) of any suitable construction for facilitating the rotation of said tuning shaft 12 to be made by an operator or television viewer. The other end of this tuning shaft 12 is extended to a substantially intermediate portion of the channel selecting shaft 11 and tapered toward the disc connected end of the channel selecting shaft 11. This tuning shaft 12 is movable in the axial direction between a projected position and a depressed position and normally biased to the projected position by a compression spring 17 operatively inserted between the front plate 10*b* of the framework 10 and a stopper ring 12*a* rigidly mounted on the tuning shaft 12 substantially as shown in FIG. 2.

Within a space defined between the bearing member 14 and a partition plate 18 suitably secured to the side plate 10*a* of the framework 10, there is accommodated a rotatable drum 19 non-rotatably mounted on the channel selecting shaft 11 so that rotation of the shaft 11 accompanies the corresponding rotation of the rotatable drum 19. It is to be noted that the partition plate 18 is formed at a suitable portion with an opening in coaxial relation with respect to the opening 10*c* of the front plate 10*b* for receiving therethrough the channel selecting shaft 11, said opening of the partition plate 18 having the diameter slightly larger than the diameter of the channel selecting shaft 11, but smaller than the outer diameter of the tapered end extremity of the hollow tuning shaft 12 so that the depressed position of movement of the tuning shaft 12 can be defined in which condition the tapered end extremity of the tuning shaft 12 that has been backwardly moved away from the projected position against the spring 17 abuts against the partition plate 18 substantially as shown.

The rotatable drum 19, which may be made of hard synthetic resin or non-magnetic metal, is formed with a plurality of holes, generally indicated by 19*a*, located adjacent to the periphery of said drum 19 in equally spaced relation with respect to the axis of said drum 19 and with respect to one another. Each of these holes 19*a* extends in the rotatable drum 19 in parallel relation to the axis of said drum 19 and is used to loosely accommodate therein any one of a plurality of adjustable control elements as generally indicated by 20.

The number of the holes 19*a* of the drum 19 preferably corresponds to the number of the detent notches 13*a* of the turret disc 13, but may not be limited thereto. In practice, either the number of the holes 19*a* or the number of the detent notches 13*a* may be determined depending upon the number of channels in the UHF band for the transmission of television signals. For example, assuming that the channel allocations in any given area are twelve, the number of the holes 19*a* or the detent notches 13*a* should be at least twelve to provide twelve detent stop positions in the tuning mechanism, the number of necessary control elements 20 being correspondingly determined.

The rotatable drum 19 is formed on its peripheral surface with window portions 19*b* in register with the respective holes 19*a* in the rotatable drum 19, the function of which will be mentioned later.

Referring particularly to FIG. 3, the details of only one of the adjustable control elements 20 is shown in an exploded view on an enlarged scale. The adjustable control element 20 in the first preferred embodiment as shown includes a bushing member 20*a* having one tapered end 20*b* and a spindle member 20*d*. The spindle member 20 is formed with a threaded portion adapted to be threadably accommodated within the bushing member 20*a*, and also with a head portion 20*e* having one end rigidly connected or integral with one end of the spindle member 20*d* and the other end tapered outwardly from the axis of said spindle member 20*d*. A geared surface is formed on the periphery of the head portion 20*e*, so that, when a rotational force is transmitted to said geared surface in a manner as will be mentioned later, the length of this control element 20 can be varied with the spindle member 20*d* threadably moving within the bushing member 20*a* in the axial direction.

Each of the control elements 20 of the construction as shown in FIG. 3 is loosely inserted in the hole 19*a* in such a manner that the bushing member 20*a* of the control element 20 is non-rotatably, but slidably in the axial direction thereof, held within said hole 19*a* by means of a suitable keyed engagement as indicated by 21. For this purpose, the bushing member 20*a* is formed on a portion of the outer periphery thereof with a key member 20*c* as shown in FIG. 3.

For transmitting the rotational force exerted upon rotation of the tuning shaft 12 by the operator or television viewer to the geared surface of the spindle member 20*d* of the control element 20 so as to adjust the length of the control element 20, a power transmission mechanism is provided as including a drive gear 22*a*, an intermediate gear 22*b*, a first driven gear 22*c* constantly in mesh with said intermediate gear 22*b* and a second driven gear 22*d* coaxially connected with said first driven gear 22*c*. The drive gear 22*a* is rigidly mounted on the tuning shaft 12 at a position adjacent to the tapered end of said shaft 12. However, this drive gear 22*a* may be integrally formed with the tuning shaft 12. For supporting the power transmission mechanism of the construction above referred to, there is provided a slidable plate 23 arranged between the front plate 10*b* of the framework 10 and the partition plate 18. This slidable plate 23 is formed at a central portion with a substantially rectangular opening 23*a* and normally upwardly urged by a spring 24 inserted between a lower edge of said plate 23 and an engagement piece 18*a* formed in the partition plate 18 so that an inner lower edge of the opening 23*a* of the plate 23 abuts against the channel selecting shaft 11 when the tuning shaft 12 is in the projected position. However, as the tuning shaft 12 is moved to the depressed position, the tapered end of the tuning shaft 12 resting on the inner lower edge of the opening 23*a* of the slidable plate 23 causes the slidable plate 23 to move downwards against the spring 24.

In this slidable plate 23, the intermediate gear 22*b* is rotatably fitted thereto by means of a pin 25 in such a way that, when the tuning shaft 12 is in the depressed position, said intermediate gear 22*b* can be brought into mesh with said drive gear 22*a* upon downward movement of the slidable plate 23. The first driven gear 22*c* is rotatably supported by a shaft member 26 having one end rigidly mounted with said driven gear 22*c* and the other end rotatably extending through the plates 23 and 18 and connected with the second driven gear 22*d* which can be engageable with the geared surface 20*e* of the spindle member 20*d* of the control element 20 through the window portion 19*b* of the rotatable drum 19. Plate 18 and guide 30*b* moreover accommodate shaft 26 in slot-like openings therein, thereby to permit shaft 26 to slide up and down with plate 23, relatively to plate 18, as well as to rotate within the openings. From the foregoing description, it has now become clear that, when the tuning shaft 12 is in the depressed position and turned by the television viewer in either direction, the rotational force imparted to the shaft 12 or the drive gear 22*a* can be transmitted to the driven gear 22*d* through the intermediate gear 22*b* and then the first driven gear 22*c* in constant mesh with said intermediate gear 22*b*. It is also clear that, when the geared surface 20*e* of the spindle member 20*d* of the control element 20 is in mesh with the second driven gear 22*d* of the power transmission mechanism, rotation of the tuning shaft 12 results in a variation of the overall length of the adjustable control element 20.

To enable each of the control elements 20 to be, during step-by-step rotation of the drum 19, so positioned that the geared surface formed in the control element 20 is ready to engage the second driven gear 22*d* of the power transmission mechanism, a pair of fixed and movable cam members 27 and 28 are provided. As clearly shown in FIG. 3, each of these cam members 27 and 28 is of substantially isosceles triangular shape and having a pair of cam surfaces 27*b* and 27*c* or 28*b* and 28*c* and a base surface 27*a* or 28*a*. Preferably, each apex formed by the pair of the cam surfaces 27*b* and 27*c* or 28*b* and 28*c* is cut off, or alternatively slightly recessed, to form a receiving area 27*d* or 28*d* by which, in the assembled condition of the tuning mechanism, the relevant control element 20 can be held in place while sandwiched between these cam members with the longitudinal axis of said element 20 exactly in register with a reference straight line drawn between the substantial apexes respectively formed by the cam surfaces of each pair.

The fixed cam member 27 is formed at an intermediate portion of the base surface 27*a* with a fitting piece 27*e* through which said cam member 27 is rigidly secured to a suitable portion of the partition plate 18 by means of a suitable fitting procedure such as by caulking subjected to the fitting piece 27*e*. The movable cam member 28 is also formed at an intermediate portion of the base surface 28*a* with a fitting piece or bracket 28*e* through which said movable cam member 28 is operatively associated with the tuner assembly as will be mentioned later.

The cam surfaces 27*b* and 27*c* of the fixed cam member 27, as well as the cam surfaces 28*b* and 28*c* of the movable cam member 28, are adapted to permit the corresponding tapered end of the control element 20 to slide thereover during step-by-step rotation of the rotatable drum 19 until the tapered end reaches the receiving area 27*d* of the fixed cam member 27. It is to be noted that the fixed cam member 27 is preferably so sized that, when it holds the control element 20 in place in cooperation with the movable cam member 28, the geared surface of the spindle member 20*d* of the control element 20 can be brought to a position immediately below the second driven gear 22*d* engageable therewith through the window portion 19*b*.

As hereinbefore described, the movable cam member 28 is associated with a tuner operating mechanism of the construction as will be hereinafter described. The tuner operating mechanism in the first preferred embodiment includes a tuner operating slide 29 slidably supported by the side plate 10*a* of the framework 10 through a plurality of guides 30*a*, 30*b* and 30*c* all secured to said side plate 10*a*. This tuner operating slide 29 is formed adjacent to one end thereof with a rack portion 29*a* (see FIG. 2) and at a substantially intermediate portion with an elbow 29*b* to which the movable cam member 28 is rigidly secured through the bracket 28*e* in such a way that the receiving area 28*d* of this movable cam member 28 is, as hereinbefore described, registered with the receiving area 27*d* of the fixed cam member 27 in parallel relation with respect to the longitudinal axis of the drum 19 or the shaft 11.

The rack portion 29*a* is in constant mesh with a pinion 31 non-rotatably mounted on a tuner shaft 32 of a tuner assembly generally indicated by 33. The tuner assembly 33 may be of the type which covers the entire UHF television band for 180° of the rotation of the tuner shaft 32. Slidably mounted on the tuner operating slide 29 adjacent to the rack portion 29*a* is an auxiliary rack member 34 for reducing the backlash which may occur between the rack portion 29*a* and the pinion 31. To enable this auxiliary rack member 34 to act as the backlash reducing device, a compression spring 35 is provided as having one end connected with a suitable portion of the auxiliary rack member 34 and the other end connected with the framework 10 so that the rack member 34 can be biased in one direction. However, this compression spring 35 does not only act as a part of the backlash reducing device in the manner as hereinbefore described, but also acts to bias the tuner operating slide and, hence, the tuner shaft 32 in one direction. With this compression spring 35, it is to be noted that, when any one of the adjustable control elements 20 is positioned such as to make it possible to engage the second driven gear 22*d* to the geared surface of the spindle member 20*d*, the receiving area 28*d* of the movable cam member 28 is in contact with the tapered end of the bushing member 20*a* of the control element 20. Therefore, variation in the overall length of any one of the adjustable control elements 20 which can be produced by the rotation of the spindle member 20*d* effected in the manner as hereinbefore described can be transmitted through the movable cam member 28 to the tuner operating slide 29, thereby causing the latter to rotate the tuner shaft 32 by means of the engagement between the rack portion 29*a* and the pinion 31, the angle of rotation of the tuner shaft 32 being corresponded with the amount of such variation.

In constructing the tuning mechanism according to the present invention, care must be taken that the difference between the maximum distance between the receiving areas 27*d* and 28*d* of the cam members 27 and 28 attainable when the adjusted overall length of the element 20 is of the maximum value and the minimum distance therebetween attainable when said adjusted overall length is of the minimum value, that is, the maximum stroke of adjustment affordable to said element 20, should corresponds to 180° of rotation of the tuner shaft 32. In addition, the distance between the base surfaces 27*a* and 28*a* when the adjusted overall length is of the minimum value should be at least equal to the maximum adjusted overall length of the element.

Care must be also taken that, to ensure a smooth rotation of the rotatable drum in relation to each of the adjustable control elements 20, the angle formed by the intersection between each cam surface and the base surface of either of the cam members 27 and 28 is preferably of a relatively small value, in view of the fact that the number of receivable channels covered by one detent stop position of the rotatable drum 19 in any given locality is in fact limited, for example, to a few numbers of the whole channel allocations authorized by the government of a certain country. However, the greater this angle is, the more the receivable channels are covered by one detent stop position of the rotatable drum 19, since a relatively greater stroke of adjustment can be available to each control element 20.

With the arrangement as hereinbefore described, assuming that the rotatable drum 19 is rotated to any preset one of the detent stop positions, the corresponding adjustable control element 20 loosely accommodated in the hole 19*a* of the rotatable drum 19 can be received between the receiving areas 27*d* and 28*d* of the cam members 27 and 28 in such a way that the tapered end of the spindle member 20*d* slides over either of the cam surfaces 27*b* or 27*c* to the receiving area 27*d* while the tapered end of the bushing member 20*a* simultaneously or subsequently slides over the corresponding cam surface 28*b* or 28*c* to the receiving area 28*d* causing the cam member 28 and, hence, the tuner operating slide 29 to move in either direction. As the tuner operating slide 29 is thus operated, the tuning can be effected to the tuner assembly 33 to set the television receiver (not shown) ready to receive a selected one of UHF television channels receivable in one detent stop position of the rotatable drum 19.

In the event that the television receiver is desired to be set to receive another UHF television channel while the rotatable drum is maintained in the same detent stop position, what is necessary is to push and turn the tuning shaft 12. In such case, as the shaft 12 is pushed to position in the depressed position against the spring 17, the slidable plate 23 can be downwardly moved against the spring 24 with the lower inner edge of the opening 23*a* sliding over the tapered end of said shaft 12. Upon completion of the downward movement of the slidable plate 23 at which time the tuning shaft 12 has been completely brought into the depressed position, the intermediate gear 22*b* constantly in mesh with the driven gear 22*c*, both carried by the slidable plate 23, engages the drive gear 22*a* on the shaft 12 and, at the same time, the second driven gear 22*d* connected with said first driven gear 22*c* engages the geared surface of the spindle member 20*d* of the control element 20.

While in the above condition, rotation of the tuning shaft 12 in the depressed position results in the adjustment of the overall length of the corresponding control element 20 in such a way that, upon rotation of the spindle member 20 by the engagement between the first driven gear 22*d* and the geared surface thereof, the bushing member 20*a* is moved in either direction depending upon the direction of rotation of the tuning shaft 12. As the overall length of the control element 20 is extended or shortened, the movable cam 28 and, hence, the tuner operating slide 29 can be moved in one specific direction so that the tuner shaft 32 can be rotated through a certain angle of rotation corresponding to the amount of adjustment thus effected to the control element in the manner as hereinbefore described.

It is to be noted that, unless otherwise the tuning shaft 12 is excessively rotated to an extent that the television receiver is set to receive another UHF television channel, the tuning mechanism of the present invention can be used as a fine tuning device although the performance of a tuner affects the design practice.

After the desired channel has been preset as described, subsequent rotation of the tuning shaft 12 back to that channel position causes the tuner assembly to be reset to that channel with great accuracy.

The other embodiment of the present invention shown in FIG. 4 through FIG. 6 functions in the substantially same manner as the first embodiment shown in FIG. 1 through FIG. 3 does. However, in this embodiment of FIG. 4 through FIG. 6, a substantial number of movable parts are advantageously eliminated as compared with the first preferred embodiment. Accordingly, only differences between the tuning mechanism in the first preferred embodiment and that in the second preferred embodiment will be hereinafter described for the sake of brevity.

Referring now to FIGS. 4 through 6, and particularly as shown in FIGS. 5 and 6, each of the control elements 20 is formed with a single rod 200 and includes a cylindrical piece 200*a* having a projection 200*b* and a movable cylindrical piece 200*c*, which may be of the same shape as that of the cylindrical piece 200*a*, having a projection 200*d* and a threaded surface 200*e* formed on the whole inner surface of said cylindrical piece 200*c*. As shown, the rod 200 is formed at one end extremity with a key 201 so sized as will be mentioned later, and a mounting area 202 for rotatably receiving the cylindrical piece 200*a*, the remaining portion of said rod 200 being formed with a threaded portion 203 for threadably receiving said movable cylindrical piece 200*c*. In this arrangement, it is to be noted that the cylindrical piece 200*a* mounted on the mounting area 202 of the rod 200 does not move in the axial direction of said rod 200 while the movable cylindrical piece 200*c* can be threadably moved in said direction upon rotation of the rod 200. It is also to be noted that the term "overall length (of the control element 20)" above referred to should be construed as defined between the projections 200*b* and 200*d* of said respective cylindrical pieces 200*a* and 200*c*. This overall length of the control element shown in FIGS. 4 through 6 is, of course, adjustable for the same purpose as described in connection with the first preferred embodiment shown in FIGS. 1 through 3.

Because of the particular shape of the control element in the second preferred embodiment as hereinbefore described, the rotatable drum 19 is designed such that the each window portion 19*b* is enlarged to the end of the drum 19 remote from the front plate 10*b* of the framework 10 thereby to permit the movable cylindrical piece 200*c* to move to and fro with respect to the cylindrical piece 200*a* with the projection 200*d* thereof being exposed to the outside of said rotatable drum 19. Of course, the fixed and movable cam members 27 and 28 are respectively operatively associated with the cylindrical pieces 200*a* and 200*c* when the rotatable drum 19 is in any one of the detent stop positions substantially as shown in FIG. 4.

The power transmission mechanism which has been described as including such gears as indicated by 22*a* to 22*d* in the first preferred embodiment includes, in the second preferred embodiment, the drive gear 22*a* mounted on the tuning shaft 12 in the same fashion as in the first embodiment and a gear wheel 22*e* constantly in mesh with said drive gear 22*d*. The gear wheel 22*e* is rigidly mounted on a shaft 226 having one end journalled at a suitable portion of the front plate 10*b* and the other end formed with a key groove 226*a* of the cruciform shape for collapsibly receiving the key 201 therein of the rod 200. It is to be noted that the axis of the shaft 226 carrying the gear wheel 22*e* should be in alignment with the axis of said rod 200. Inserted between the gear wheel 22*e* and the partition plate 18 around the shaft 226 is a compression spring 217 used to bias the gear wheel 22*e* toward the front plate 10*b*. A stop ring 12*b* for enabling the movement of the shaft 226 against the spring 217 toward the control element 20 may be integrally formed with the gear 22*a* or rigidly mounted on the tuning shaft 12 without any gap between said stop ring 12*b* and the gear 22*a*.

The arrangement of the second preferred embodiment of the present invention is such that, when the tuning shaft 12 is pushed to the depressed position, the gear wheel 22*e* can be moved toward the partition plate 18 against the spring 217 while the movement of said gear wheel 22*e* in the biasing direction of the spring 217 is restricted by the stop ring 12*b*, resulting in that the cruciform groove 226*a* of the shaft 226 in its axial movement receives therein the key 201. Accordingly it is clear that rotation of the tuning shaft 12 results in the rotation of the rod 200 of the control element whereby the distance between the projections 200*b* and 200*d* of the cylindrical pieces 200*a* and 200*c*, that is, the overall length of the control element, can be adjusted to achieve the same purpose as hereinbefore described in connection with the first preferred embodiment.

Attention is directed to the turret disc 13 which is shown as fitted to the end of the rotatable drum 19 in the second embodiment without utilizing the pair of retaining rings 15*a* and 15*b*. In the event that the shaft 11 is desired to be rotated by a remote control device, an additional gear wheel must be rigidly mounted on the shaft 11 so that it can be rotated by a motor of the remote control device. In such case, the turret disc 13 in the second embodiment is recommended to be arranged as shown in FIGS. 1 and 2. Alternatively, in the event that no remote control device is necessitated, the turret disc 13 in the first embodiment may be arranged such as shown in FIG. 4.

In either of the first and second preferred embodiments of the present invention, since each of the adjustable control elements 20 is axially displaceably accommodated in the rotatable drum 19, resetting of the tuner to one particular UHF television channel can be ensured with great accuracy even if the rotatable drum 19 becomes displaced in the axial directions during the life time of the tuning mechanism of the present invention. This accounts for the elimination of the use of expensive bearing devices such as ball bearings for compensating for possible displacement of the rotatable drum which have been heretofore largely employed.

Although the present invention has been fully disclosed in conjunction with the preferred embodiments with reference to the accompanying drawings, it is to be noted that various changes and modifications are apparent to those skilled in the art. For example, the spring 17 shown in FIGS. 1 and 2 may be eliminated since, if the spring 24 has a sufficient resiliency, this spring 24 can be concurrently used to bias the tuning shaft 12 in one direction. In addition, the employment of two independent knobs for the tuning shaft and the channel selecting shaft can be eliminated. In this case, what is necessary is to form a cruciform groove on the end extremity of the tuning shaft 12 having a knob while a pin engageable with said cruciform groove on the tuning shaft end extremity is rigidly inserted across the channel selecting shaft 11, so that, only when this knob is backwardly pressed, the engagement between the turning shaft 12 and the channel selecting shaft 11 can be released. Accordingly, such modifications and changes should be construed as included within the scope of the present invention unless otherwise departing therefrom.

What is claimed is:

1. A tuning mechanism comprising in combination;

a tuner including an adjustable control shaft to tune said tuner over a range of frequencies;

a rotatable drum coaxially non-rotatably mounted on a channel selecting shaft, said drum being formed with a plurality of holes parallely extending in the axial direction of said drum adjacent and around the periphery thereof;

a plurality of adjustable control elements axially displaceably accommodated in said holes of said drum, respectively;

detent means for providing at least one detent stop position for each of said control elements;

means including a pair of fixed and movable cam members for holding any selected one of said adjustable control elements in place between said cam members in response to step-by-step rotation of said drum effected in cooperation with said detent means;

a tuning shaft rotatably mounted on said channel selecting shaft for operatively associating with said selected control element to adjust said selected control element upon rotation of said tuning shaft; and means including a tuner operating member operatively associated with said tuner control shaft for tuning said tuner over a range of frequencies in response to the movement of said tuner operating member effected by means of said movable cam member during the adjustment of said selected control element.

2. A tuning mechanism as claimed in claim 1, wherein each of said adjustable control elements comprises a spindle member and a bushing member, said spindle member having a first, tapered end and a second, threaded end, said second end being threadably received in said bushing member, said bushing member thereby being capable of moving to and fro with respect to said spindle member during the adjustment of said control element.

3. A tuning mechanism as claimed in claim 1, wherein each of said adjustable control elements comprises a rod member and first and second cylindrical pieces, said rod member having one end portion for receiving said first cylindrical piece in free rotational engagement thereon, said first piece being provided with a projection adapted to contact said fixed cam member, and said rod member having a second threaded end portion for receiving said second cylindrical piece in threaded, rotational engagement thereon, said second cylindrical piece being provided with a projection adapted to contact said movable cam, said second cylindrical piece being capable of moving to and fro with respect to the first cylindrical piece during the adjustment of said control element.

4. A tuning mechanism as claimed in claim 1, wherein each of said fixed and movable cam members is of substantially isosceles triangular shape and has a pair of cam surfaces of the same lengths and a base surface formed at a substantially intermediate portion with a fitting piece.

* * * * *